(12) United States Patent
Wu

(10) Patent No.: US 11,950,395 B2
(45) Date of Patent: Apr. 2, 2024

(54) HEAT DISSIPATING MECHANISM AND RELATED ELECTRONIC DEVICE

(71) Applicant: Wistron Corporation, New Taipei (TW)

(72) Inventor: Yu-Chuan Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 260 days.

(21) Appl. No.: 17/701,657

(22) Filed: Mar. 22, 2022

(65) Prior Publication Data

US 2023/0225086 A1 Jul. 13, 2023

(30) Foreign Application Priority Data

Jan. 10, 2022 (TW) ................................. 111100982

(51) Int. Cl.
*H05K 7/20* (2006.01)
*G06F 1/20* (2006.01)

(52) U.S. Cl.
CPC ....... *H05K 7/20418* (2013.01); *H05K 7/2049* (2013.01); *G06F 1/20* (2013.01)

(58) Field of Classification Search
CPC .......................... H05K 7/20418; H05K 7/2049
See application file for complete search history.

(56) References Cited

U.S. PATENT DOCUMENTS

| 2013/0208427 A1* | 8/2013 | Lin ...................... H01L 23/4006 361/720 |
| 2013/0340989 A1* | 12/2013 | Megarity ............ H01L 23/4006 165/185 |
| 2013/0342997 A1* | 12/2013 | Yeh ...................... H01L 23/4093 361/704 |

FOREIGN PATENT DOCUMENTS

| TW | 471656 | 1/2002 |
| TW | M547693 U | 8/2017 |
| TW | 201838500 A | 10/2018 |

* cited by examiner

*Primary Examiner* — Sherman Ng
(74) *Attorney, Agent, or Firm* — Winston Hsu

(57) ABSTRACT

A heat dissipating mechanism is used to dissipate heat generated by a heat generation component of an electronic device. The heat generation component is disposed on a circuit board. The heat dissipating mechanism includes a rotation component and a heat dissipation component. The rotation component is disposed on the circuit board. The heat dissipation component is rotatably disposed on the rotation component. The heat dissipation component includes a contacting surface and a fin body. The contacting surface is a bottom surface of the fin body and configured to contact against the heat generation component.

17 Claims, 10 Drawing Sheets

HEAT DISSIPATING MECHANISM AND RELATED ELECTRONIC DEVICE

BACKGROUND OF THE DISCLOSURE

1. Field of the Disclosure

The present disclosure relates to a heat dissipating mechanism and an electronic device, and more particularly, to a heat dissipating mechanism with a quick releasing function and a related electronic device.

2. Description of the Prior Art

In an assembly process of a conventional heat dissipating mechanism, a heat conduction component is inserted into a slot structure to contact a heat generation component, and a fixing component is used to lock the heat conduction component with the slot structure via an external tool. The fixing component is a screw or a bolt, and the external tool is a screwdriver. The assembly process of the conventional heat dissipating mechanism is complicated and wastes time, and the heat conduction component or the heat generation component are easily damaged by the fixing component and the external tool. In a disassembly process of the conventional heat dissipating mechanism, the screw or the bolt are detached by the external tool for a removal of the heat conduction component and the heat generation component. The conventional heat dissipating mechanism has low assembly and disassembly efficiency, and components of the conventional heat dissipating mechanism are easily damaged in the assembly and disassembly process. Therefore, design of a heat dissipating mechanism having advantages of quick assembly/disassembly and easy operation without any external tool is an important issue in the related mechanical design industry.

SUMMARY OF THE DISCLOSURE

The present disclosure provides a heat dissipating mechanism with a quick releasing function and a related electronic device for solving above drawbacks.

According to the claimed disclosure, a heat dissipating mechanism configured to touch a heat generation component and dissipate heat generated by the heat generation component is disclosed. The heat generation component is disposed on a circuit board. The heat dissipating mechanism includes a rotation component and a heat dissipation component. The rotation component is disposed on the circuit board. The heat dissipation component is rotatably disposed on the rotation component. The heat dissipation component includes a contacting surface and a fin body. The contacting surface is a bottom surface of the fin body and configured to contact against the heat generation component.

According to the claimed disclosure, the heat dissipation component further includes an axle portion disposed on a lateral side of the fin body and cooperated with the rotation component for rotation of the heat dissipation component.

According to the claimed disclosure, the heat dissipation component further includes a guiding portion. The fin body includes a plurality of fin units. The guiding portion and the plurality of fin units are respectively stretched from the fin body toward opposite directions, and the guiding portion detachably contacts against the heat generation component.

According to the claimed disclosure, the rotation component includes a base and a pivoting portion. The pivoting portion is disposed on a side of the base. The base is disposed on the circuit board and cooperated with the heat dissipation component for clamping the heat generation component.

According to the claimed disclosure, the base includes a plurality of heat dissipating fins.

According to the claimed disclosure, the heat dissipation component further includes a supporting portion, and the fin body includes a plurality of fin units. The plurality of fin units and the supporting portion are respectively stretched from the fin body toward opposite directions, and the supporting portion detachably contacts against the circuit board.

According to the claimed disclosure, the heat dissipation component further includes a pushing portion, and the fin body includes a plurality of fin units. The plurality of fin units and the pushing portion are respectively disposed on two sides of the rotation component, and the pushing portion detachably contacts against the circuit board.

According to the claimed disclosure, an electronic device includes a circuit board, a heat generation component and a heat dissipating mechanism. The heat generation component is connected to the circuit board. The heat dissipating mechanism is configured to fix the heat generation component and dissipate heat generated by the heat generation component. The heat dissipating mechanism includes a rotation component and a heat dissipation component. The rotation component is disposed on the circuit board. The heat dissipation component is rotatably disposed on the rotation component. The heat dissipation component includes a contacting surface and a fin body. The contacting surface is a bottom surface of the fin body and configured to contact against the heat generation component.

According to the claimed disclosure, the circuit board includes a holding portion, and the heat dissipation component includes a positioning portion disposed on a lateral side of the fin body and detachably contacting against the holding portion.

According to the claimed disclosure, a heat dissipating mechanism is disposed in a chassis and used to touch a heat generation component and dissipate heat generated by the heat generation component. The heat dissipating mechanism includes a rotation component and a heat dissipation component. The rotation component is disposed on a casing of the chassis. The heat dissipation component is rotatably disposed on the rotation component. The heat dissipation component includes a contacting surface and a fin body. The contacting surface is a bottom surface of the fin body and configured to contact against the heat generation component.

The electronic device of the present disclosure provides three embodiments to fix and dissipate the heat of the heat generation component by the heat dissipating mechanism. The heat dissipating mechanism of the first embodiment can utilize the rotation component to dispose the heat dissipation component on the circuit board, and the guiding portion can be disposed on the contacting surface of the heat dissipation component; when the heat generation component is rotated toward the circuit board at a predefined position, the guiding portion can be pressed to simultaneously rotate the heat dissipation component relative to the circuit board for pressing the heat generation component. The heat dissipating mechanism of the second embodiment can dispose the supporting portion and the pushing portion to two opposite surfaces of the heat dissipation component; the supporting portion can support the fin body to prevent the heat generation component from accidentally hitting by the fin body, and the pushing portion can be forced to abut against the circuit board for constraining the heat dissipation component at the specific angle. The heat dissipating mechanism of the third embodiment can position one lateral side of the heat dissipation component on the circuit board via the rotation component, and the other lateral side of the heat dissipation component can be detachably attached to the circuit board via assembly of the positioning portion and the holding portion. Thus, the heat dissipating mechanism and the electronic device of the present disclosure do not utilize complicated tools to assemble and disassemble the heat generation component, and have advantages of rapid operation speed and low risk of damage.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
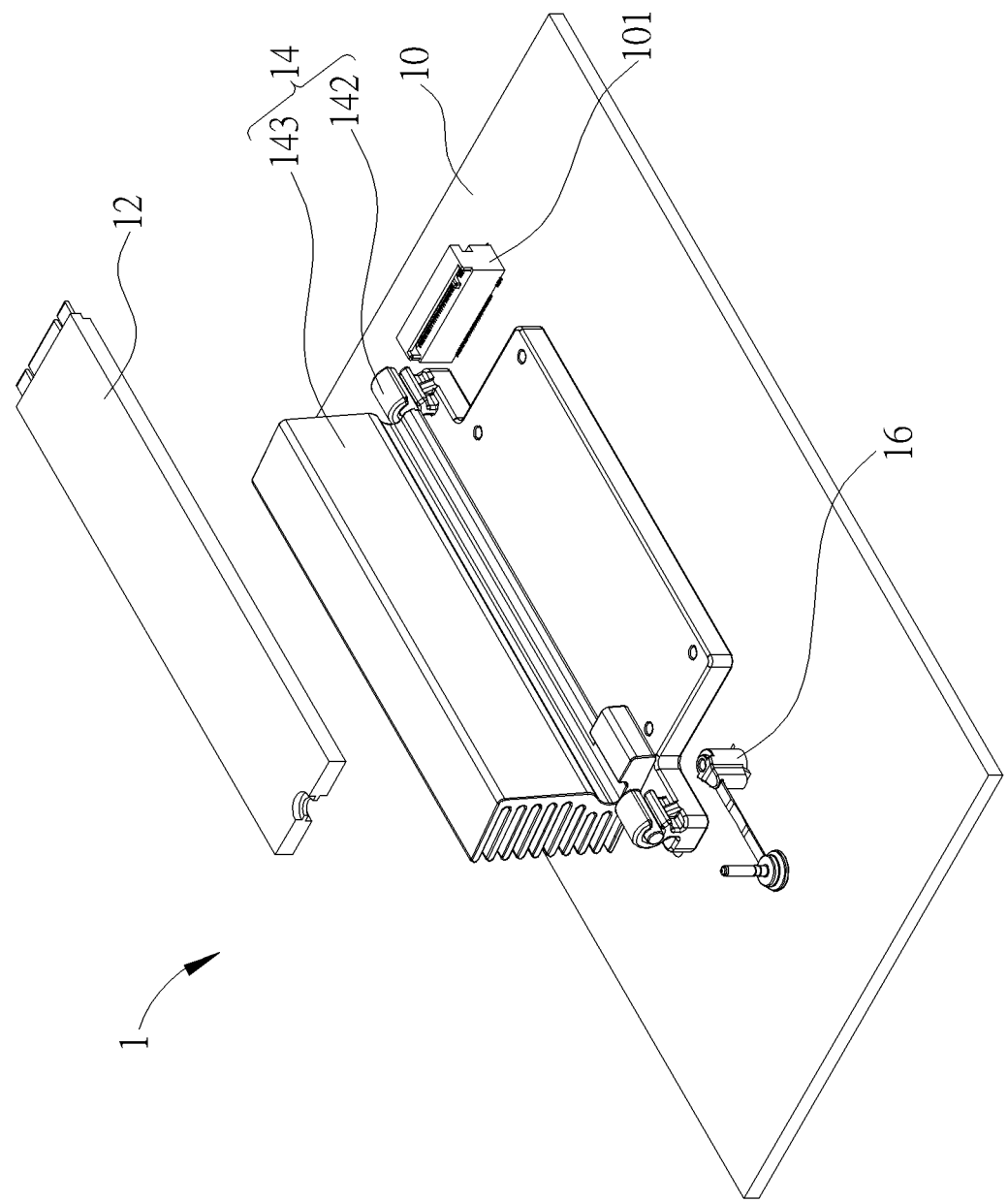
FIG. 1 is a diagram of parts of an electronic device according to an embodiment of the present disclosure.

Please refer to FIG. 1. FIG. 1 is a diagram of parts of an electronic device 1 according to an embodiment of the present disclosure. The electronic device 1 can be a variety of computer apparatuses or server apparatuses, which depends on an actual demand. The electronic device 1 can include a circuit board 10, a heat generation component 12 and a heat dissipating mechanism 14. The circuit board 10 can be disposed inside the electronic device 1 and connected to the heat generation component 12. The heat generation component 12 can be a hard disk, an interface card, or any electronic component generating waste heat. The heat dissipating mechanism 14 can contact the heat generation component 12 and be used to dissipate heat generated by the heat generation component 12. The heat dissipating mechanism 14 can economize inner space of the electronic device 1, and have a tooless detaching function so that the heat generation component 12 can be detached and attached rapidly and conveniently.

Figure 2:
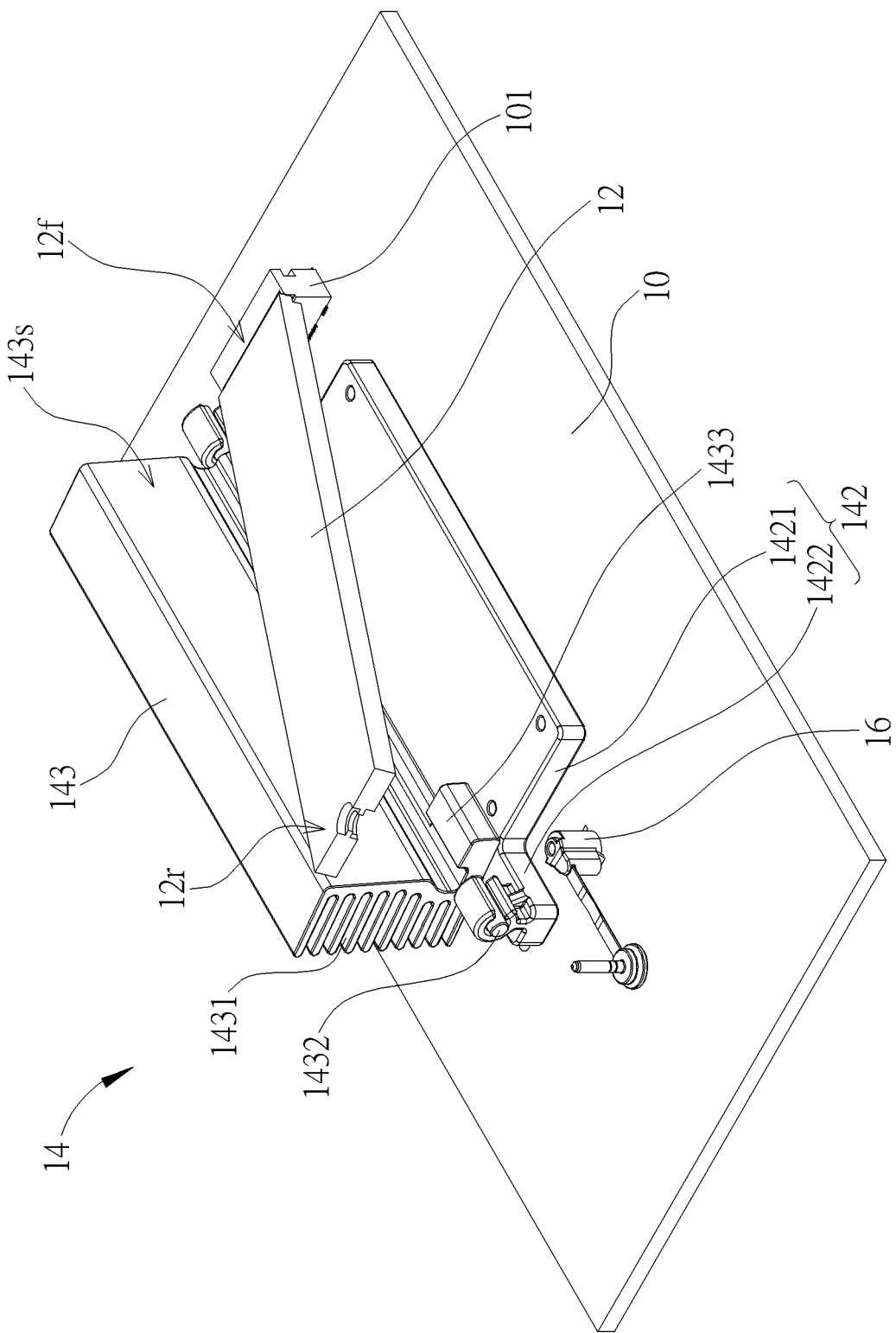
FIG. 2 to FIG. 4 are diagrams of the heat dissipating mechanism in different operation modes according to a first embodiment of the present disclosure.
Figure 3:
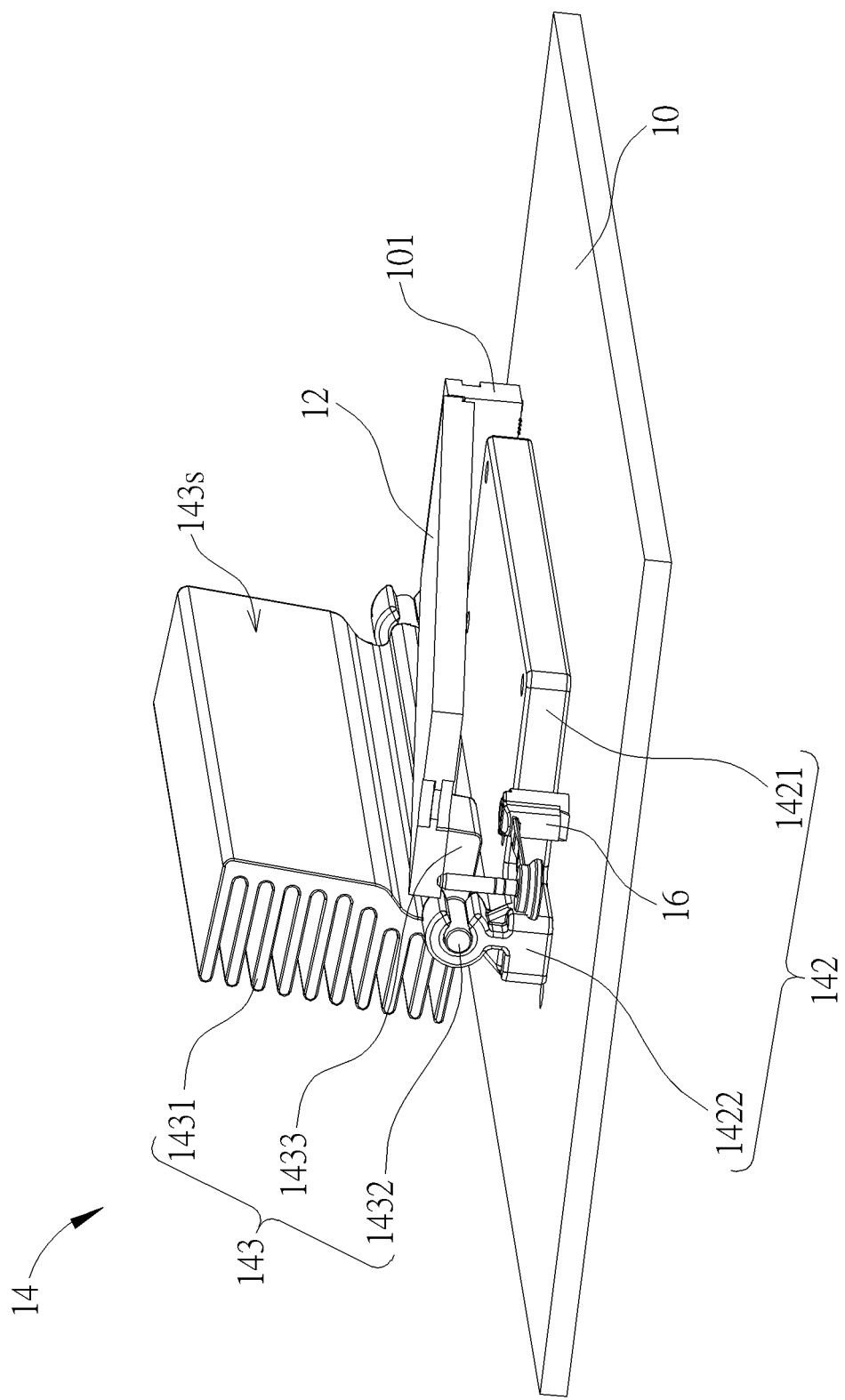
Figure 4:
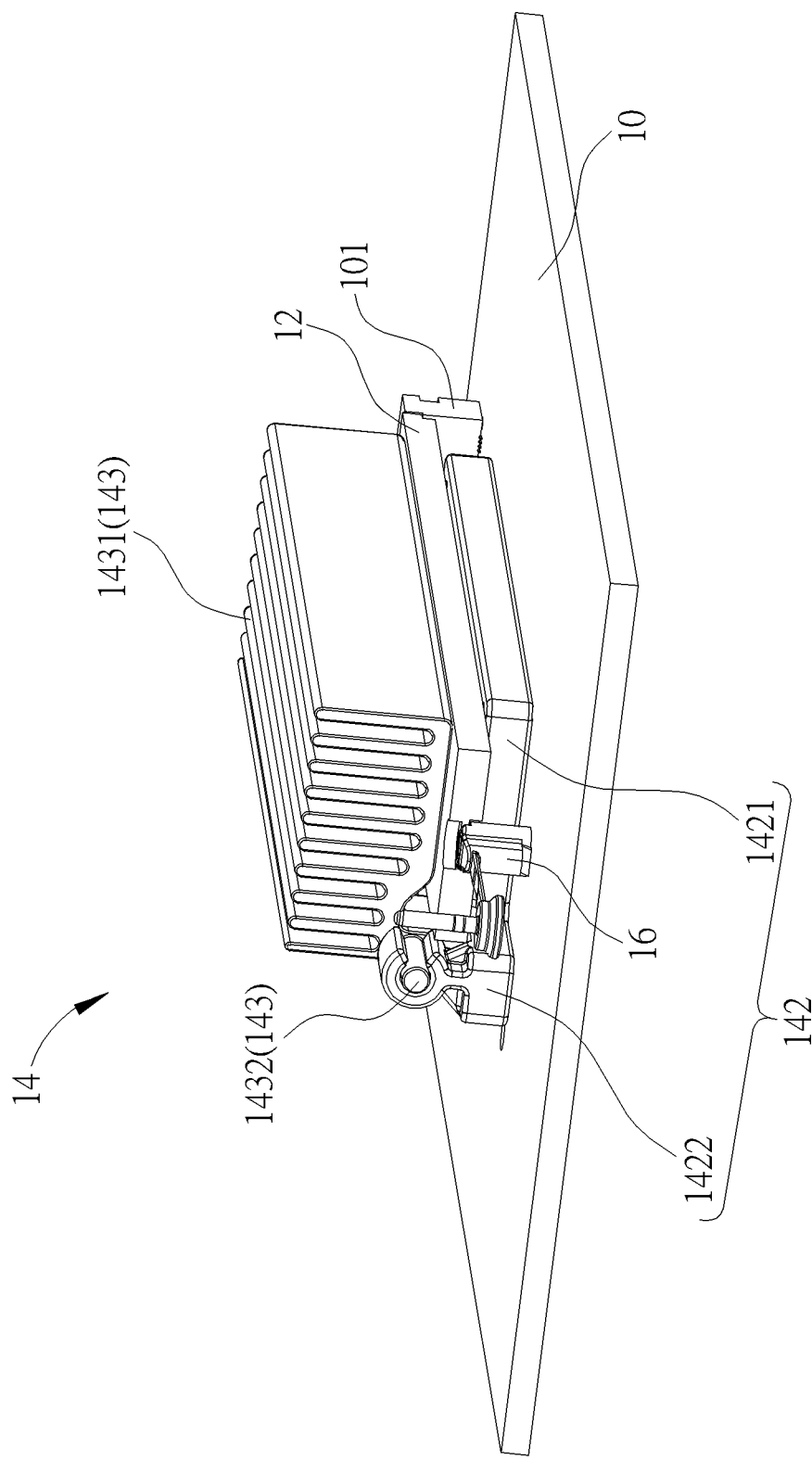
Figure 10:
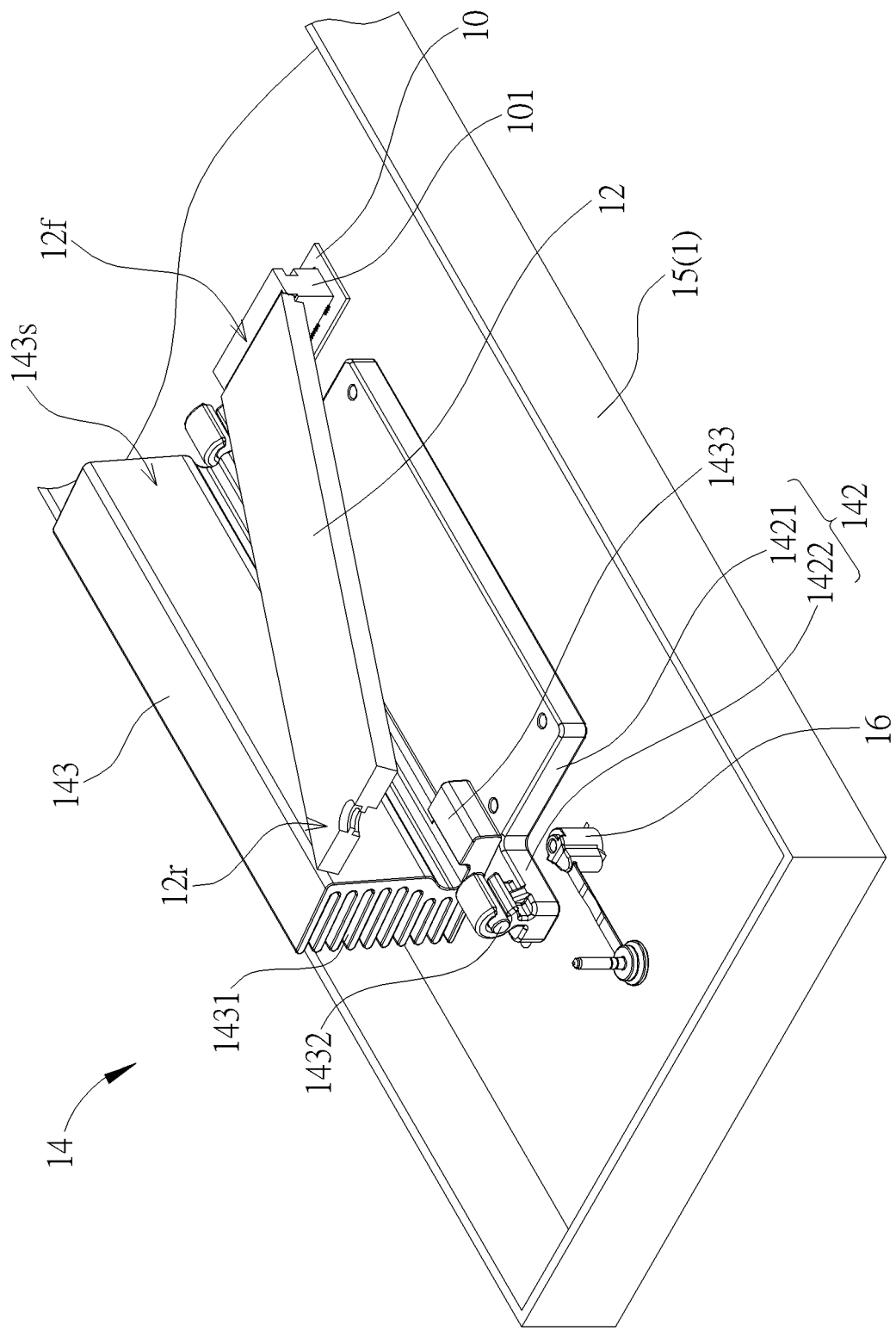
FIG. 10 is a diagram of the heat dissipating mechanism in another type according to the first embodiment of the present disclosure.

Please refer to FIG. 2 to FIG. 4 and FIG. 10. FIG. 2 to FIG. 4 are diagrams of the heat dissipating mechanism 14 in different operation modes according to a first embodiment of the present disclosure. FIG. 10 is a diagram of the heat dissipating mechanism 14 in another type according to the first embodiment of the present disclosure. The heat dissipating mechanism 14 can include a rotation component 142 and a heat dissipation component 143. The heat dissipating mechanism 14 can be disposed on the circuit board 10 or a casing 15 of the electronic device 1, which depends on a design demand. In some possible embodiment, the heat dissipating mechanism 14 can be disposed on the circuit board 10, and the circuit board 10 can be used to hold the heat generation component 12, the heat dissipating mechanism 14 and other electronic components. The circuit board 10 can have a connector 101, and the heat generation component 12 is electrically connected to the circuit board 10 via the connector 101.

In some possible embodiment, the rotation component 142 can include a base 1421 and a pivoting portion 1422. The base 1421 can be disposed on the circuit board 10. The pivoting portion 1422 can be disposed adjacent to the base 1421. A shape and a size of the base 1421 and a type and a number of the pivoting portion 1422 are not limited to the embodiment shown in the figures, and depend on the design demand.

The heat dissipation component 143 is connected to the rotation component 142 in a rotatable manner. The heat dissipation component 143 can optionally include a fin body 1431, an axle portion 1432 and a guiding portion 1433. The fin body 1431 can be made by high thermal conductive material, and have several fin units to increase air-contacting surface and enhance heat dissipation efficiency. The axle portion 1432 can be disposed on a lateral side of the fin body 1431. The pivoting portion 1422 can be a C-typed structure used to assemble with the axle portion 1432 made as a column structure. Shapes of the axle portion 1432 and the pivoting portion 1422 are not limited to the embodiment shown in the figures; for example, the axle portion 1432 can be designed as the C-typed structure and the pivoting portion 1422 can be designed as the corresponding column structure. Any matched structures of pivoting to each other can belong to a design scope of the axle portion 1432 and the pivoting portion 1422 in the present disclosure.

Figure 5:
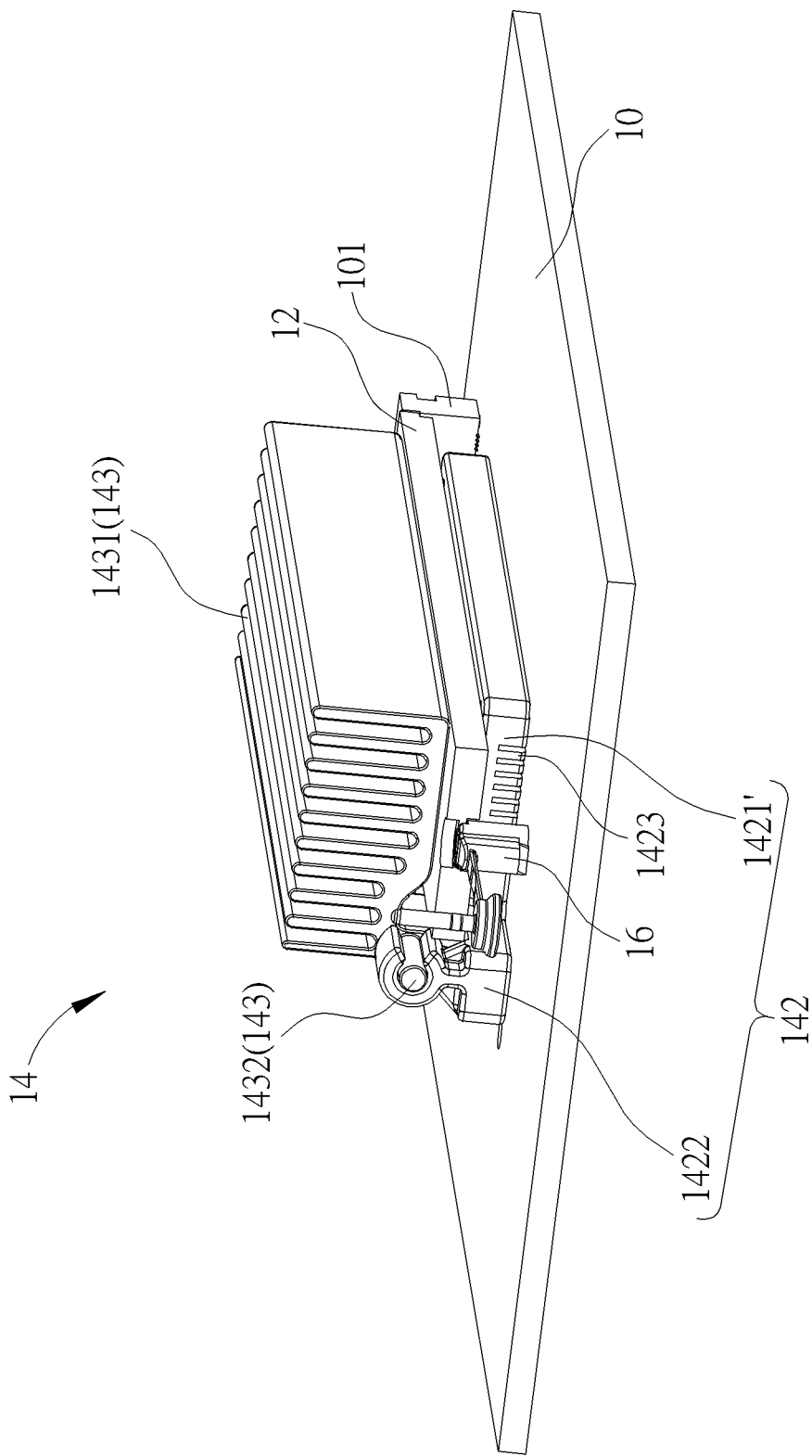
FIG. 5 is a diagram of the rotation component in another type according to the first embodiment of the present disclosure.

A surface of the fin body 1431 facing the heat generation component 12 can be defined as a contacting surface 143s of the heat dissipation component 143. The contacting surface 143s can contact against the heat generation component 12, and the heat of the heat generation component 12 can be transmitted to the heat dissipation component 143 for cooling the heat generation component 12. In some possible embodiment, the rotation component 142 can include the base 1421 disposed on the circuit board 10, and therefore the heat generation component 12 can be clamped by the base 1421 and the heat dissipation component 143. In another possible embodiment, as shown in FIG. 5, the base 1421' of the rotation component 142 can include a plurality of fin units to increase the air-contacting surface and enhance the heat dissipation efficiency.

In some possible embodiment, the heat dissipation component 143 can have the guiding portion 1433 protruded from the contacting surface 143s toward a direction opposite to the fin body 1431. The guiding portion 1433 and the fin units of the fin body 1431 are respectively stretched toward opposite directions. As shown in FIG. 2 and FIG. 4, the guiding portion 1433 can be preferably disposed adjacent to the axle portion 1432 and distant from the connector 101. The guiding portion 1433 can be pushed by the heat generation component 12 to drive rotation of the axle portion 1432, and further rotate the fin body 1431 of the heat dissipation component 143 relative to the circuit board 10.

Assembly and disassembly processes of the heat generation component 12 and the heat dissipating mechanism 14 are described as following. As shown in FIG. 2, a front end 12f of the heat generation component 12 can be inserted into the connector 101 of the circuit board 10. Then, a rear end 12r of the heat generation component 12 can be pressed by the user, and the heat generation component 12 can be rotated by the heat generation component 12 relative to the connector 101 toward the circuit board 10 via the front end 12*f* as an axle center, as shown in FIG. 3. The rear end 12*r* of the heat generation component 12 can be still pressed even though the heat generation component 12 contacts against the guiding portion 1433; in the meantime, the guiding portion 1433 and the heat generation component 12 are rotated toward the circuit board 10 simultaneously, and therefore the heat dissipation component 143 can be rotated relative to the rotation component 142. When the heat dissipation component 143 is rotated relative to the rotation component 142 and reaches a predefined angle (such as in a level position), as shown in FIG. 4, the heat dissipation component 143 can be set in a folded state, and the contacting surface 143*s* of the heat dissipation component 143 can contact against an upper surface of the heat generation component 12, so that the heat of the heat generation component 12 can be transmitted to the heat dissipation component 143 for dissipation. The base 1421 of the rotation component 142 can be pressed by a lower surface of the heat generation component 12 for holding the heat generation component 12. A value of the predefined angle can be decided by an included angle between the fin body 1431 and the guiding portion 1433, and computation of the predefined angle is omitted herein for simplicity.

When the heat generation component 12 is positioned, the heat generation component 12 can be fixed on the electronic device 1 via a fixing component 16, so as to prevent the heat generation component 12 from being rotated upwardly for preferred assembling stability. The fixing component 16 can be disposed on the circuit board 10 or the casing 15 of the electronic device 1. Position of the fixing component 16 can depend on a size of the heat generation component 12. A type, a number and a fastening manner of the fixing component 16 are not limited to the embodiment shown in the figures, which depend on the design demand. If the heat generation component 12 is fixed onto the circuit board 10 via the fixing component 16, the heat dissipating mechanism 14 does not utilize extra fixing mechanism to prevent the heat dissipation component 143 from upward rotation, so as to economize structural space and material cost. Besides, the heat dissipating mechanism 14 may optionally design an additional mechanism to constrain the upward rotation of the heat dissipation component 143 in accordance with the actual demand, and a detailed description is omitted herein for simplicity.

For disassembling the heat generation component 12, the fixing component 16 is removed for a start, and then the heat dissipation component 143 can be rotated and distant from the circuit board 10. The heat dissipation component 143 can be switched from the folded state shown in FIG. 4 to an unfolded state shown in FIG. 3. The guiding portion 1433 of the heat dissipation component 143 can push the rear end 12*r* of the heat generation component 12 to lift the heat generation component 12 relative to the circuit board 10. Because the guiding portion 1433 can detachably contact against the heat generation component 12, so that the heat generation component 12 can be directly disassembled from the connector 101 of the circuit board 10 and separated from the heat dissipating mechanism 14.

Please refer to FIG. 5. FIG. 5 is a diagram of the rotation component 142 in another type according to the first embodiment of the present disclosure. As shown in FIG. 2 to FIG. 4, the base 1421 of the above-mentioned embodiment can be a plate structure for holding the heat generation component 12, and preferably be made by high thermal conductive material. In the embodiment shown in FIG. 5, the base 1421' of the rotation component 142 can be made by high thermal conductive material and further include a plurality of heat dissipating fins 1423, which is aimed to increase the air-contacting surface and enhance the heat dissipation efficiency of the heat dissipating mechanism 14.

Figure 6:
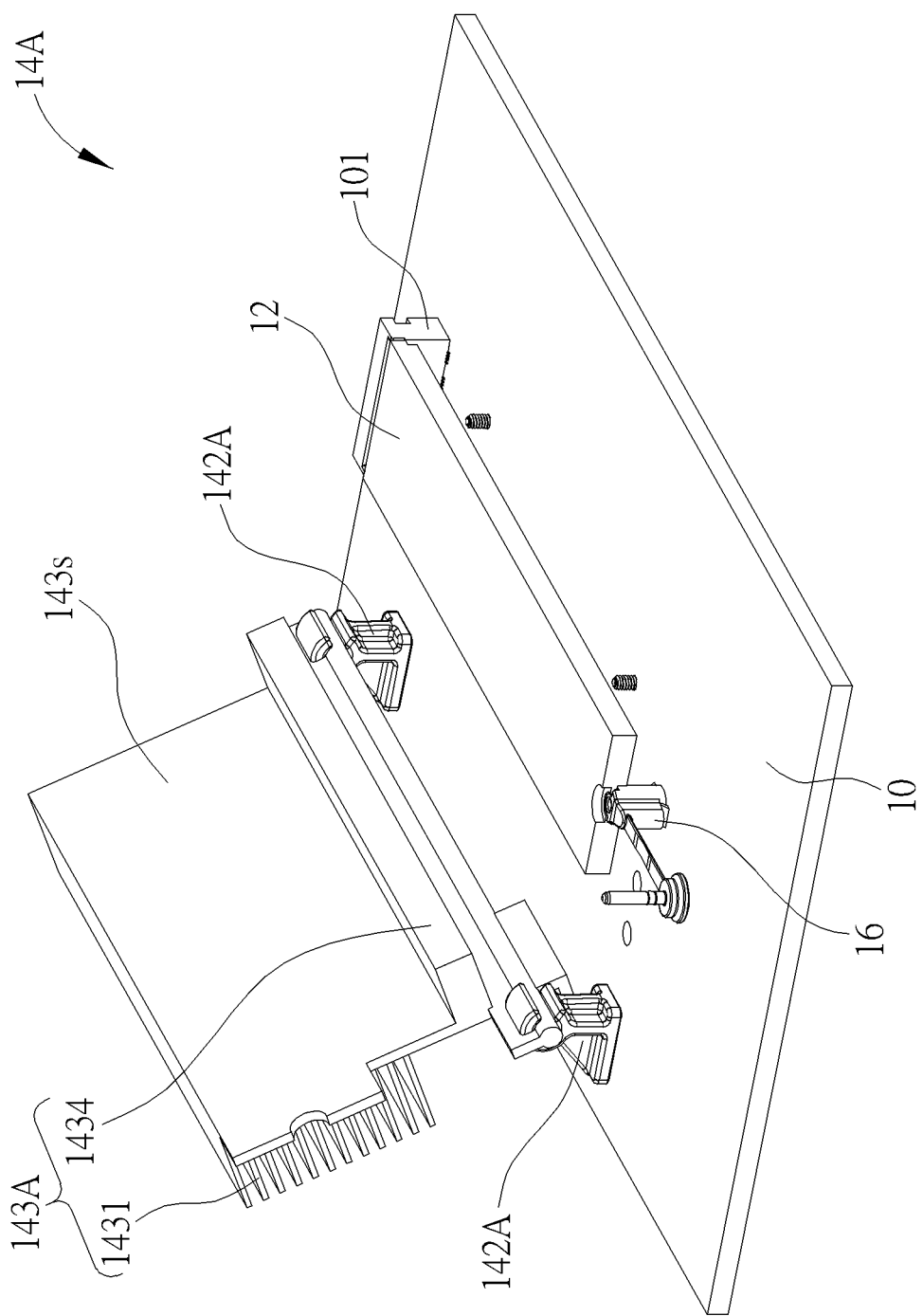
FIG. 6 and FIG. 7 are diagram of the heat dissipating mechanism in different operation modes according to a second embodiment of the present disclosure.
Figure 7:
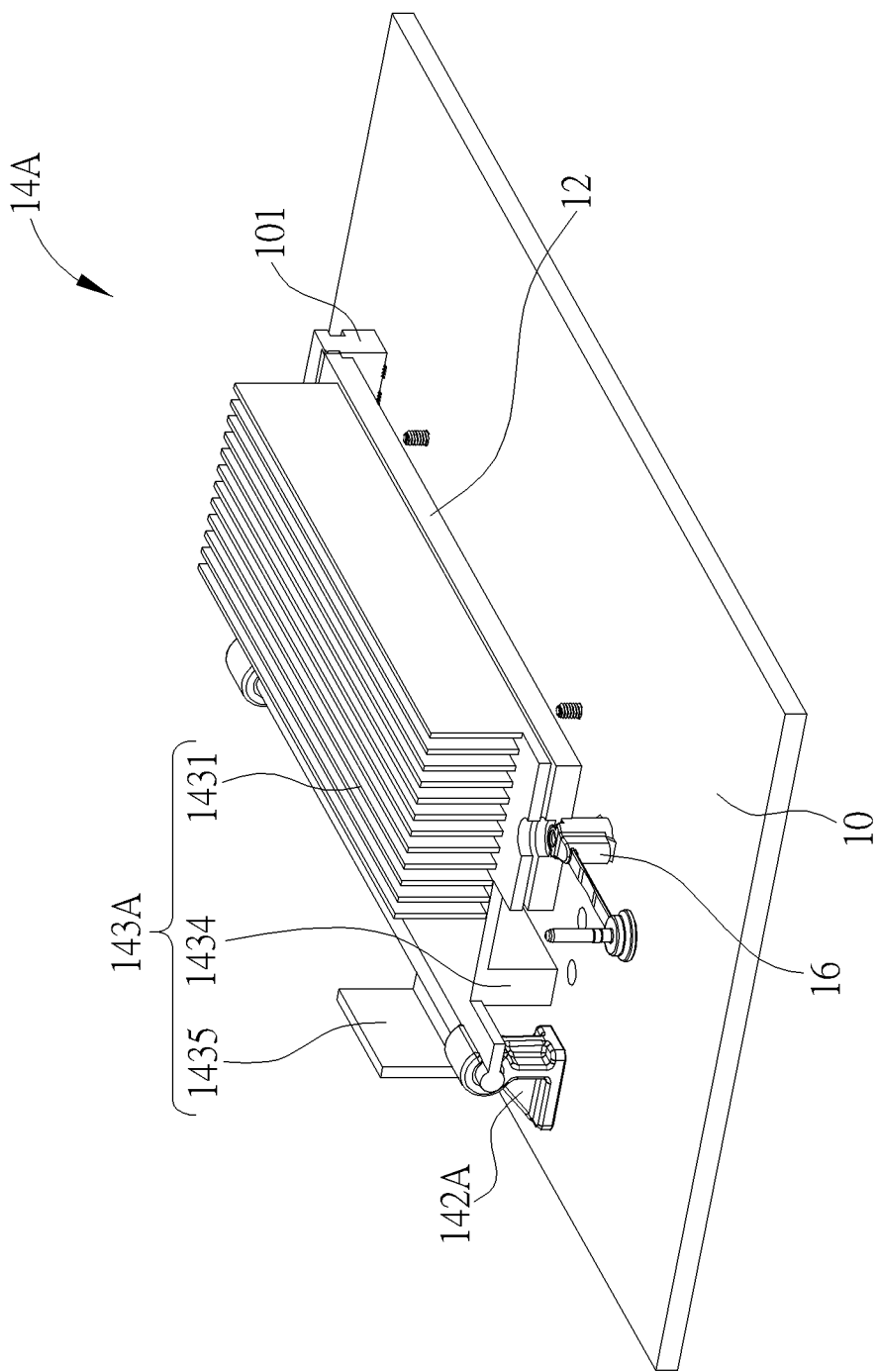

Please refer to FIG. 6 and FIG. 7. FIG. 6 and FIG. 7 are diagram of the heat dissipating mechanism 14A in different operation modes according to a second embodiment of the present disclosure. In the second embodiment, elements having the same numerals as ones of the first embodiment have the same structures and functions, and a detailed description is omitted herein for simplicity. The heat dissipating mechanism 14 can include a rotation component 142A and a heat dissipation component 143A. The rotation component 142A can be disposed on the circuit board 10. The heat dissipation component 143A can be pivoted to the rotation component 142A, and freely rotated relative to the circuit board 10. The heat dissipation component 143A can optionally include the fin body 1431, a supporting portion 1434 and a pushing portion 1435. The supporting portion 1434 can be protruded from the contacting surface 143*s* toward a direction opposite to the fin body 1431. The supporting portion 1434 and the fin units of the fin body 1431 are respectively stretched toward opposite directions. The pushing portion 1435 can be disposed on the lateral side of the axle portion 1432 opposite to the fin body 1431. The supporting portion 1434 and the pushing portion 1435 are protruded from the fin body 1431 respectively toward different directions.

In some possible embodiment, the heat generation component 12 can be inserted into the connector 101 of the circuit board 10 at any angle, and then the heat generation component 12 can be pressed to rotate relative to the connector 101 toward the circuit board 10, as shown in FIG. 6. The heat dissipation component 143A can be pushed to rotate relative to the circuit board 10 via the rotation component 142A, and the heat dissipation component 143A can be switched from position shown in FIG. 6 to position shown in FIG. 7. The contacting surface 143*s* of the heat dissipation component 143 can contact against the heat generation component 12 to dissipate the heat generated by the heat generation component 12. In the situation, the supporting portion 1434 of the heat dissipation component 143A can abut against the circuit board 10 to ensure that the contacting surface 143*s* of the heat dissipation component 143A contacts the heat generation component 12. An interval between the circuit board 10 and the contacting surface 143*s* of the heat dissipation component 143A can be the same as or similar to a thickness of the heat generation component 12. For disassembling the heat generation component 12, the pushing portion 1435 can be pressed to rotate the heat dissipation component 143A relative to the rotation component 142A, and the heat dissipation component 143A can be rotated and distant from the circuit board 10. The heat dissipating component 143A can be switched from position shown in FIG. 7 to position shown in FIG. 6, and then the heat generation component 12 can be removed freely. Moreover, the pushing portion 1435 can abut against the circuit board 10 to constrain the rotation angle of the heat dissipation component 143A, so as to prevent the heat dissipation component 143A from suddenly falling and hitting the heat generation component 12.

Figure 8:
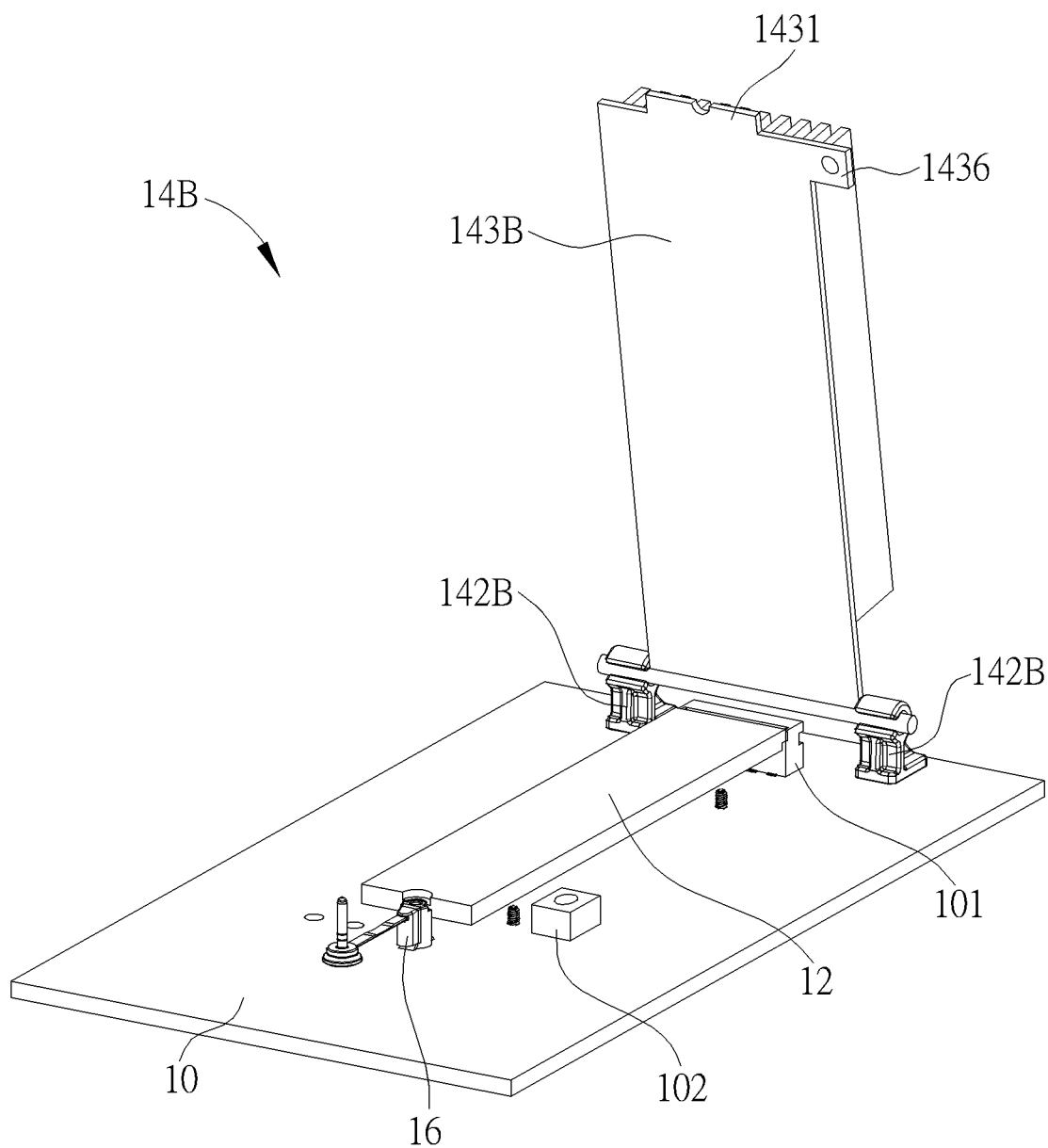
FIG. 8 and FIG. 9 are diagrams of a heat dissipating mechanism in different operation modes according to a third embodiment of the present disclosure.
Figure 9:
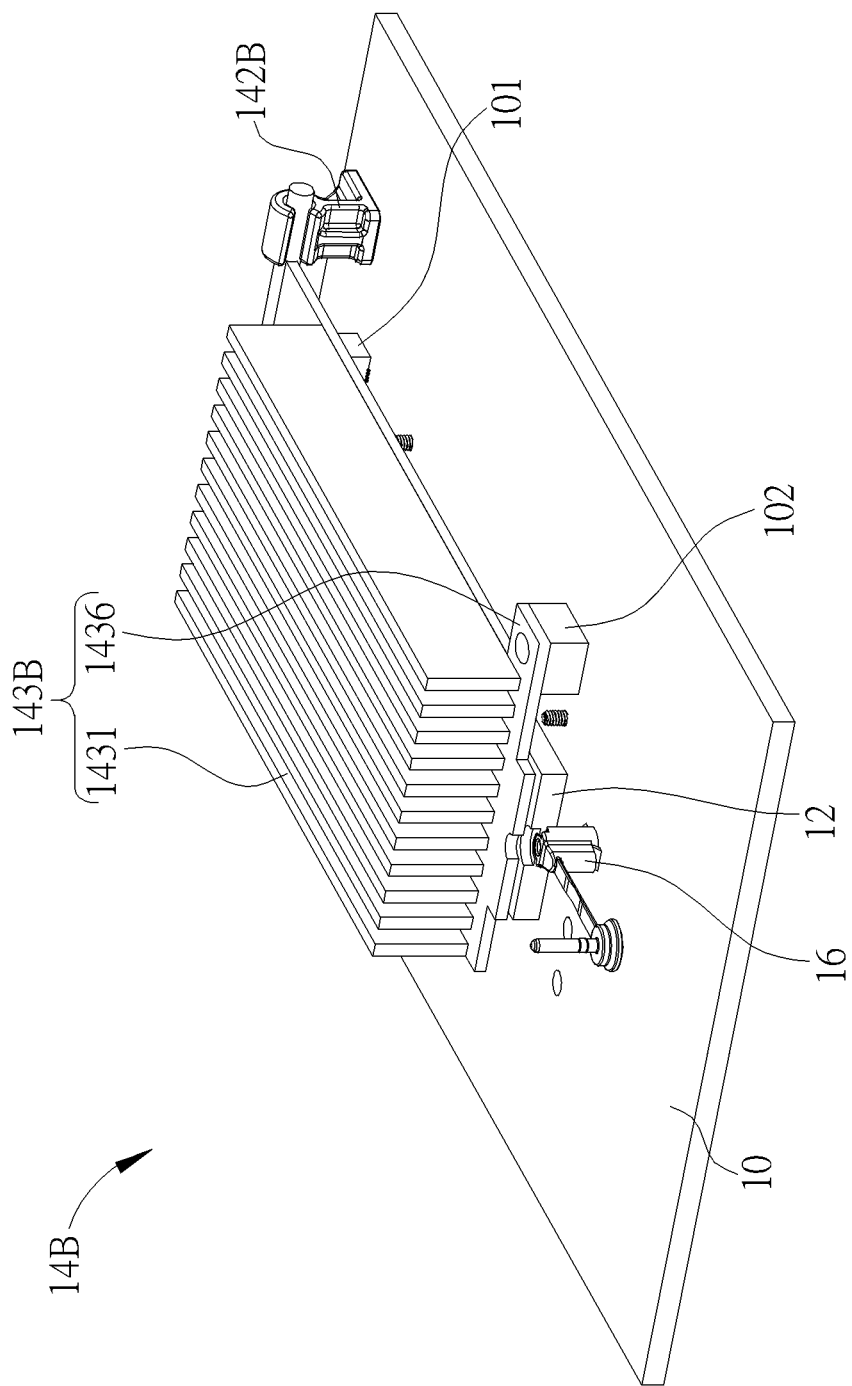

Please refer to FIG. 8 and FIG. 9. FIG. 8 and FIG. 9 are diagrams of a heat dissipating mechanism 14B in different operation modes according to a third embodiment of the present disclosure. In the third embodiment, the elements having the same numeral as ones of the foresaid embodiments have the same structures and functions, and a detailed description is omitted herein for simplicity. The heat dissipating mechanism 14B can include a rotation component 142B and a heat dissipation component 143B. The circuit board 10 can include a holding portion 102, and position of the holding portion 102 can depend on the size of the heat generation component 12. A height of the holding portion 102 can be equal to or slightly greater than the thickness of the heat generation component 12. The rotation component 142B can be disposed on the circuit board 10 and adjacent to the connector 101. The heat dissipation component 143B can include the fin body 1431 and a positioning portion 1436. The positioning portion 1436 can be disposed on the lateral side of the fin body 1431 opposite to the axle portion 1432, and correspond to position of the holding portion 102.

For assembling the heat generation component 12 and the heat dissipating mechanism 14, the heat generation component 12 can be inserted into the connector 101 of the circuit board 10, and the heat generation component 12 can be pressed to rotate relative to the connector 101 toward the circuit board 10, such as from position shown in FIG. 8 to position shown in FIG. 9; in the meantime, the positioning portion 1436 of the heat dissipation component 143B can abut against the holding portion 102. Because the height of the holding portion 102 can be equal to or slightly greater than the thickness of the heat generation component 12, the heat generation component 12 can be protected and not hit by the heat dissipation component 143B. Besides, the positioning portion 1436 of the heat dissipation component 143B can be locked onto the holding portion 102 of the circuit board 10 via an external component (which is not shown in the figures). Rotation of the heat dissipation component 143B can be constrained by locking between the positioning portion 1436 and the holding portion 102, so that the heat generation component 12 can be stably clamped by the circuit board 10 and the heat dissipation component 143B. For disassembling the heat generation component 12, the holding portion 102 can be separated from the positioning portion 1436, and the heat dissipation component 143B can be pushed and rotated relative to the circuit board 10, and then the heat generation component 12 can be disassembled from the connector 101.

In conclusion, the electronic device of the present disclosure provides three embodiments to fix and dissipate the heat of the heat generation component by the heat dissipating mechanism. The heat dissipating mechanism of the first embodiment can utilize the rotation component to dispose the heat dissipation component on the circuit board, and the guiding portion can be disposed on the contacting surface of the heat dissipation component; when the heat generation component is rotated toward the circuit board at a predefined position, the guiding portion can be pressed to simultaneously rotate the heat dissipation component relative to the circuit board for pressing the heat generation component. The heat dissipating mechanism of the second embodiment can dispose the supporting portion and the pushing portion to two opposite surfaces of the heat dissipation component; the supporting portion can support the fin body to prevent the heat generation component from accidentally hitting by the fin body, and the pushing portion can be forced to abut against the circuit board for constraining the heat dissipation component at the specific angle. The heat dissipating mechanism of the third embodiment can position one lateral side of the heat dissipation component on the circuit board via the rotation component, and the other lateral side of the heat dissipation component can be detachably attached to the circuit board via assembly of the positioning portion and the holding portion. Thus, the heat dissipating mechanism and the electronic device of the present disclosure do not utilize complicated tools to assemble and disassemble the heat generation component, and have advantages of rapid operation speed and low risk of damage.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A heat dissipating mechanism configured to dissipate heat generated by the heat generation component, the heat generation component being disposed on a circuit board, the heat dissipating mechanism comprising: a rotation component disposed on the circuit board; and a heat dissipation component rotatably disposed on the rotation component, the heat dissipation component comprising a contacting surface and a fin body, the contacting surface being a bottom surface of the fin body and configured to contact against the heat generation component, wherein the heat dissipation component further comprises an axle portion disposed on a lateral side of the fin body and cooperated with the rotation component for rotation of the heat dissipation component.

2. The heat dissipating mechanism of claim 1, wherein the heat dissipation component further comprises a guiding portion, the fin body comprises a plurality of fin units, the guiding portion and the plurality of fin units are respectively stretched from the fin body toward opposite directions, and the guiding portion detachably contacts against the heat generation component.

3. The heat dissipating mechanism of claim 1, wherein the rotation component comprises a base and a pivoting portion, the pivoting portion is disposed on a side of the base, the base is disposed on the circuit board and cooperated with the heat dissipation component for clamping the heat generation component.

4. The heat dissipating mechanism of claim 3, wherein the base comprises a plurality of heat dissipating fins.

5. The heat dissipating mechanism of claim 1, wherein the heat dissipation component further comprises a supporting portion, the fin body comprises a plurality of fin units, the plurality of fin units and the supporting portion are respectively stretched from the fin body toward opposite directions, and the supporting portion detachably contacts against the circuit board.

6. The heat dissipating mechanism of claim 1, wherein the heat dissipation component further comprises a pushing portion, the fin body comprises a plurality of fin units, the plurality of fin units and the pushing portion are respectively disposed on two sides of the rotation component, and the pushing portion detachably contacts against the circuit board.

7. An electronic device, comprising: a circuit board; a heat generation component connected to the circuit board; and a heat dissipating mechanism configured to fix the heat generation component and dissipate heat generated by the heat generation component, the heat dissipating mechanism comprising: a rotation component disposed on the circuit board; and a heat dissipation component rotatably disposed on the rotation component, the heat dissipation component comprising a contacting surface and a fin body, the contacting surface being a bottom surface of the fin body and configured to contact against the heat generation component, wherein the heat dissipation component further comprises an axle portion disposed on a lateral side of the fin body and cooperated with the rotation component for rotation of the heat dissipation component.

8. The electronic device of claim 7, wherein the heat dissipation component further comprises a guiding portion, the fin body comprises a plurality of fin units, the guiding portion and the plurality of fin units are respectively stretched from the fin body toward opposite directions, and the guiding portion detachably contacts against the heat generation component.

9. The electronic device of claim 7, wherein the rotation component comprises a base and a pivoting portion, the pivoting portion is disposed on a side of the base, the base is disposed on the circuit board and cooperated with the heat dissipation component for clamping the heat generation component.

10. The electronic device of claim 9, wherein the base comprises a plurality of heat dissipating fins.

11. The electronic device of claim 7, wherein the heat dissipation component further comprises a supporting portion, the fin body comprises a plurality of fin units, the plurality of fin units and the supporting portion are respectively stretched from the fin body toward opposite directions, and the supporting portion detachably contacts against the circuit board.

12. The electronic device of claim 7, wherein the heat dissipation component further comprises a pushing portion, the fin body comprises a plurality of fin units, the plurality of fin units and the pushing portion are respectively disposed on two sides of the rotation component, and the pushing portion detachably contacts against the circuit board.

13. The electronic device of claim 7, wherein the circuit board comprises a holding portion, the heat dissipation component comprises a positioning portion disposed on a lateral side of the fin body and detachably contacting against the holding portion.

14. A heat dissipating mechanism disposed in a chassis and used to touch a heat generation component and dissipate heat generated by the heat generation component, the heat dissipating mechanism comprising: a rotation component disposed on a casing of the chassis; and a heat dissipation component rotatably disposed on the rotation component, the heat dissipation component comprising a contacting surface and a fin body, the contacting surface being a bottom surface of the fin body and configured to contact against the heat generation component, wherein the heat dissipation component further comprises an axle portion disposed on a lateral side of the fin body and cooperated with the rotation component for rotation of the heat dissipation component.

15. The heat dissipating mechanism of claim 14, wherein the heat dissipation component further comprises a guiding portion, the fin body comprises a plurality of fin units, the guiding portion and the plurality of fin units are respectively stretched from the fin body toward opposite directions, and the guiding portion detachably contacts against the heat generation component.

16. The heat dissipating mechanism of claim 14, wherein the heat dissipation component further comprises a supporting portion, the fin body comprises a plurality of fin units, the plurality of fin units and the supporting portion are respectively stretched from the fin body toward opposite directions, and the supporting portion detachably contacts against the casing.

17. The heat dissipating mechanism of claim 14, wherein the heat dissipation component further comprises a pushing portion, the fin body comprises a plurality of fin units, the plurality of fin units and the pushing portion are respectively disposed on two sides of the rotation component, and the pushing portion detachably contacts against the casing.

* * * * *